US008362928B2

(12) United States Patent
Lee et al.

(10) Patent No.: US 8,362,928 B2
(45) Date of Patent: Jan. 29, 2013

(54) KEYPAD ASSEMBLY

(75) Inventors: Joo-Hoon Lee, Yongin-si (KR); Sun-Tae Jung, Anyang-si (KR); Dong-Hoon Jang, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 992 days.

(21) Appl. No.: 11/686,393

(22) Filed: Mar. 15, 2007

(65) Prior Publication Data

US 2007/0257822 A1 Nov. 8, 2007

(30) Foreign Application Priority Data

Mar. 28, 2006 (KR) ........................ 10-2006-0027923

(51) Int. Cl.
*H03K 17/94* (2006.01)

(52) U.S. Cl. .............. 341/22; 341/20; 341/31; 200/278; 200/295; 200/310; 200/313; 200/314; 385/129; 385/147

(58) Field of Classification Search .................... 341/20, 341/22, 31; 200/310, 313, 295, 314, 278; 385/129, 147
See application file for complete search history.

(56) References Cited

U.S. PATENT DOCUMENTS

| | | | | |
|---|---|---|---|---|
| 4,343,975 | A * | 8/1982 | Sado | 200/314 |
| 5,026,135 | A * | 6/1991 | Booth | 385/130 |
| 5,128,842 | A * | 7/1992 | Kenmochi | 362/95 |
| 5,165,005 | A * | 11/1992 | Klainer et al. | 385/129 |
| 5,397,867 | A * | 3/1995 | Demeo | 200/5 A |
| 5,521,345 | A * | 5/1996 | Wulc | 200/317 |
| 5,861,113 | A * | 1/1999 | Choquette et al. | 264/1.24 |
| 6,753,034 | B2 * | 6/2004 | Ives, Jr. et al. | 427/163.2 |
| 7,046,908 | B2 * | 5/2006 | Bierhoff et al. | 385/147 |
| 7,053,799 | B2 * | 5/2006 | Yu et al. | 341/31 |
| 7,646,956 | B2 * | 1/2010 | Hwao et al. | 385/131 |
| 2002/0088930 | A1 * | 7/2002 | Graham et al. | 250/227.11 |
| 2003/0179979 | A1 * | 9/2003 | Ouchi | 385/14 |
| 2003/0202336 | A1 * | 10/2003 | Ostergard et al. | 362/24 |
| 2005/0150753 | A1 * | 7/2005 | Hsu | 200/314 |
| 2005/0167254 | A1 * | 8/2005 | Oosawa | 200/314 |
| 2006/0067651 | A1 * | 3/2006 | Chui | 385/147 |
| 2007/0240972 | A1 * | 10/2007 | Lee et al. | 200/314 |

FOREIGN PATENT DOCUMENTS

| | | |
|---|---|---|
| JP | 11-073837 | 3/1999 |
| KR | 2004-039846 | 5/2004 |
| KR | 2006-021966 | 3/2006 |
| KR | 2006-117699 | 11/2006 |

* cited by examiner

*Primary Examiner* — Brian Zimmerman
*Assistant Examiner* — Amine Benlagsir
(74) *Attorney, Agent, or Firm* — Cha & Reiter, LLC

(57) ABSTRACT

A keypad assembly using a waveguide for guiding lights emitted from light emitting devices is disclosed. The keypad assembly includes a switch board having a plurality of dome switches. The keypad also includes a plurality of key buttons; a plurality of light emitting devices included in the switch board; a waveguide formed under the key buttons, the waveguide having a predetermined refractive index to allow lights emitted from the light emitting devices to travel according to an internal total reflection condition; a plurality of reflecting patterns formed in the waveguide to reflect the light traveling through the waveguide toward the key buttons; and an auxiliary layer formed on the surface of the waveguide, the auxiliary layer having lower refractive index than that of the waveguide to make a constant total reflection condition.

20 Claims, 5 Drawing Sheets

KEYPAD ASSEMBLY

CLAIM OF PRIORITY

This application claims priority under 35 U.S.C. §119(a) to a Korean Patent Application entitled "A Keypad Assembly," filed in the Korean Intellectual Property Office on Mar. 28, 2006, and assigned Serial No. 2006-27923, the content of which is hereby incorporated by reference.

BACKGROUND OF THE INVENTION

1. Field of the Invention

The present invention relates to a keypad assembly, and in particular, to a keypad assembly in which an auxiliary layer having lower refractive index than that of a waveguide, for guiding a light, is formed on the surface of the waveguide.

2. Description of the Related Art

A "portable communication apparatus" refers to an electronic apparatus that is carried by a user and that is capable of performing wireless communication. Examples of the portable communication apparatus include HHPs (hand held phones), CT-2 cellular phones, digital phones, PCS (personal communication service) phones, and PDAs (personal digital assistants). Generally, portable communication apparatuses or portable wireless terminals are classified according to their appearance. For example, wireless terminals are classified into bar-type wireless terminals, flip-type wireless terminals, and folder-type wireless terminals. Such portable terminals are equipped with antenna, data input/output components, and data transmission/reception components. Keypads allowing data input through a finger press task are generally used as the data input/output components.

A keypad used for data input includes a plate-shaped elastic pad; a plurality of key buttons having characters printed thereon and being placed on the top surface of the elastic pad; and a plurality of protrusions on the bottom surface of the elastic pad. The portable terminals generally include a plurality of light emitting devices, typically 15-20 devices, for backlighting the key pad. The light emitting devices are of a top view type.

FIG. 1 is a cross-sectional view of a conventional keypad assembly 1. The keypad assembly 1 includes a keypad 2, a switch board 3, and a plurality of Light Emitting Diodes (LEDs) 4.

The keypad 2 includes an elastic pad 2*a* that is made of a flexible material (e.g., rubber) and that is plate-shaped; a plurality of key buttons 2*b* that are formed on the top surface of the elastic pad 2*a* and that has numbers and characters printed thereon; and a plurality of pressing protrusions 2*c* that are formed on the bottom surface of the elastic pad 2*a*.

Each of the pressing protrusions 2*c* is arranged at the center of each of the key buttons 2*b* and a plurality of grooves 5 may be formed on the bottom surface of the elastic pad 2*a*. The grooves 5 are arranged around the pressing protrusions 2*c* in such a way to avoid interference caused by the LEDs 4 and the pressing protrusions 2*c*.

The switch board 3 includes a plate-shaped Printed Circuit Board (PCB) and a plurality of dome switches 3*a* formed on the top surface of the PCB, facing the keypad 2.

The LEDs 4 are mounted on the top surface of the PCB and are positioned such that they are covered by the grooves 5 of the elastic pad 2*a*.

If a user presses one of the key buttons 2*b*, a portion of the keypad 2 under the pressed key button 2*b* is deflected towards the switch board 3, and the pressing protrusion 2*c* under the deflected portion of the keypad 2 presses the dome switch 3*a*. A contact member 6 included in the dome switch 3*a* electrically contacts the pressing protrusion 2*c*.

In the operations of the dome switches 3*a*, the LEDs 4 cannot be positioned under the key buttons 2*b*. As such, only a portion of light output from the LEDs 4 is used for illumination. Consequently, the conventional keypad 2 requires a large number of LEDs to illuminate the entire keypad 2 and large amount of power.

Moreover, the manufacturing process, the time required to manufacture the terminal, and the manufacturing cost of the terminal is exorbitant due to large number of parts required in the conventional terminal.

SUMMARY OF THE INVENTION

Accordingly, the present invention has been made to solve the above problems and/or disadvantages occurring in the prior art, and to provide additional advantages.

One aspect of the present invention provides a keypad assembly having a waveguide that guides a light to a keypad and that selectively emits the light to an area that requires illumination, thereby uniformly illuminating the entire area of the keypad using a small number of light emitting devices.

Another aspect of the present invention provides a keypad assembly, in which an auxiliary layer is coated onto the surface of a waveguide of a keypad, thereby preventing the feature of an interface of the waveguide, i.e., the feature of a boundary face between key buttons/prints and a waveguide, from changing the total reflection condition of the waveguide due to external factors such as an adhesive for the key buttons or prints).

Another aspect of the present invention provides a keypad assembly including a switch board having a plurality of dome switches. The keypad assembly includes a plurality of key buttons, a plurality of light emitting devices included in the switch board, a waveguide formed under the key buttons and having a predetermined refractive index to allow lights emitted from the light emitting devices to travel according to an internal total reflection condition, a plurality of reflecting patterns formed in the waveguide to reflect the light traveling through the waveguide toward the key buttons, and an auxiliary layer coated onto the surface of the waveguide and having lower refractive index than that of the waveguide to make a constant total reflection condition in the entire area of a keypad.

Another aspect of the present invention provides a keypad assembly including a plurality of key buttons, a plurality of light emitting devices for emitting lights to the key buttons, and a switch board having a plurality of dome switches. The keypad assembly includes a waveguide formed under the key buttons and having a predetermined refractive index to allow the lights emitted from the light emitting devices to travel according to an internal total reflection condition, a plurality of reflecting patterns formed in the waveguide to reflect the light traveling through the waveguide toward the key buttons, and a first auxiliary layer and a second auxiliary layer coated on the top surface and bottom surface of the waveguide and having lower refractive indices than that of the waveguide to make a constant total reflection condition in the entire area of a keypad.

BRIEF DESCRIPTION OF THE DRAWINGS

The features and advantages of the present invention will be more apparent from the following detailed description taken in conjunction with the accompanying drawings, in which.

DETAILED DESCRIPTION OF THE INVENTION

The subject matter described in the description, including the features and configuration, are provided to assist in understanding several aspects and/or examples of the present invention. Accordingly, those of ordinary skill in the art will recognize that various changes and modifications of the embodiment described herein can and may be made without departing from the scope and spirit of the invention. Also, descriptions of well-known functions and configurations are omitted for clarity and conciseness, as such descriptions may make the subject matter of the present invention unclear. It is noted that features of the present invention and those of the prior art with the same functions will be referred with the same reference numbers.

Figure 1:
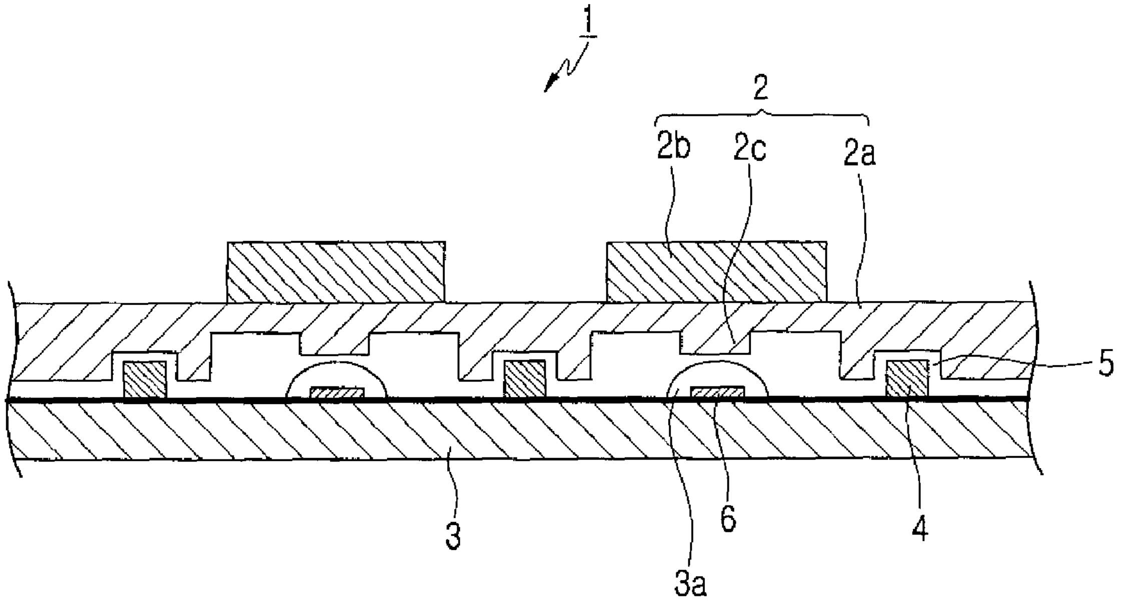
FIG. 1 (PRIOR ART)
FIG. 1 is a cross-sectional view of a conventional keypad assembly.
Figure 2:
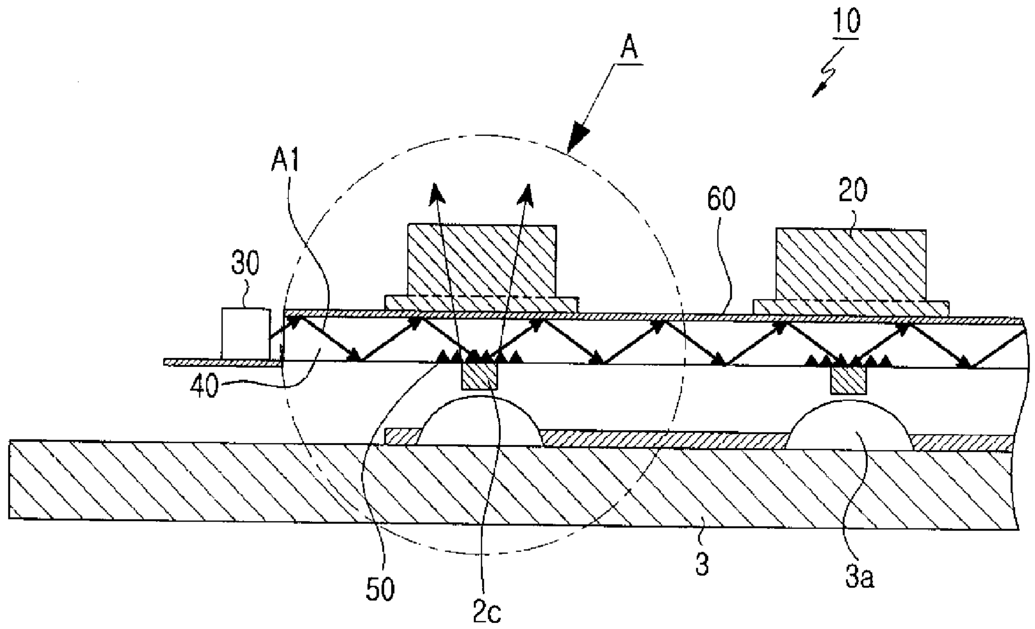
FIG. 2 is a cross-sectional view of a first example of a keypad assembly according to a first aspect of the present invention.
Figure 3:
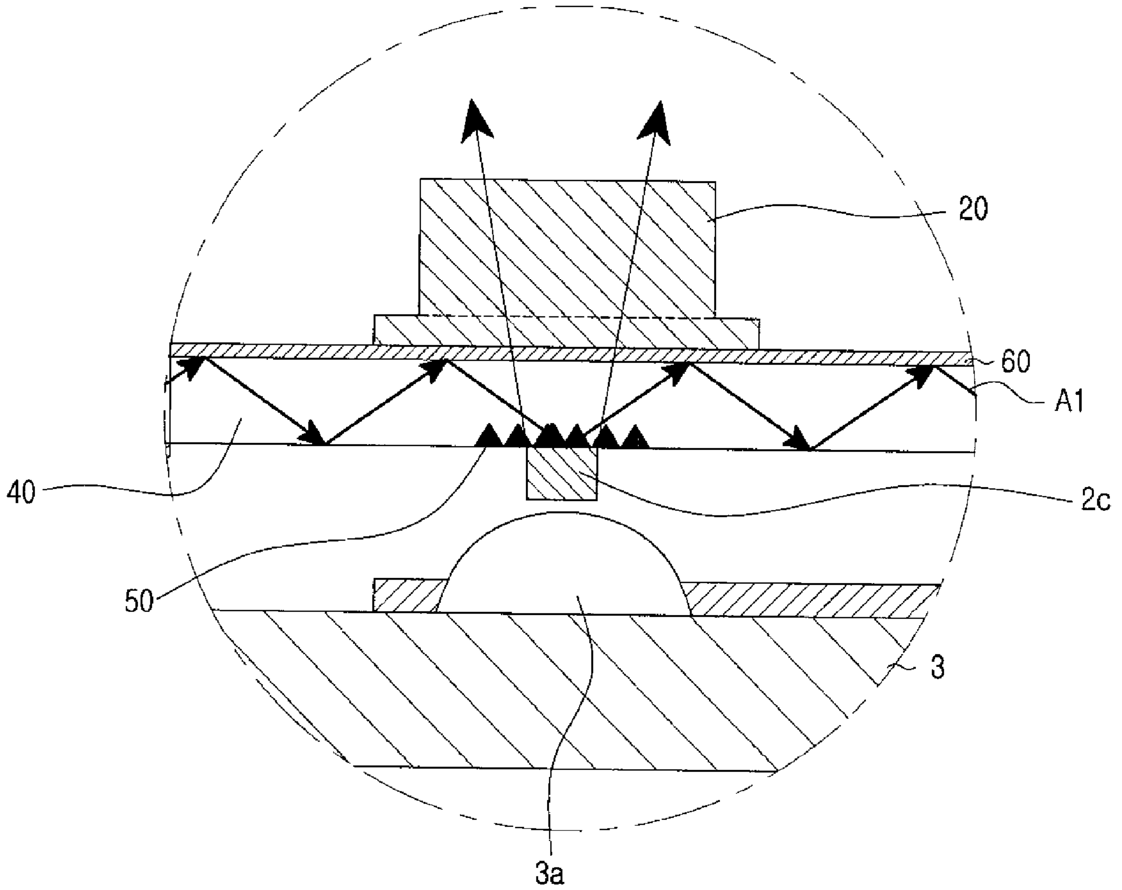
FIG. 3 is an exploded cross-sectional view of a portion A of FIG. 2.

FIGS. 2 and 3 illustrates the first example of the assembly keypad according to the first aspect of the present invention. The keypad assembly 10 according to the first example includes a plurality of key buttons 20, a plurality of light emitting devices 30, a waveguide 40, a plurality of reflecting patterns 50, and an auxiliary layer 60. The plurality of key buttons 20 are mounted on a switch board 3 that includes a plurality of dome switches 3*a*.

The plurality of light emitting devices 30 are formed at sides of the key buttons 20 in order to emit a light A1 to the waveguide 40. The waveguide 40 is provided under the key buttons 20 to allow the light A1 output from the light emitting device 30 to travel throughout the entire area of the keypad 2 (not shown). The plurality of reflecting patterns 50 are formed on the lower surface of the waveguide 40 to reflect the light A1 traveling through the waveguide 40 toward the key buttons 20.

The auxiliary layer 60 having lower refractive index than the waveguide 40 is formed on the upper surface of the waveguide 40, so that a total reflection condition may exist on the interface of the auxiliary layer 60 and the waveguide 40. In addition, an interface with air having a refractive index of 1 is formed under the waveguide 40. As the refractive index of the air is lower than that of the waveguide 40, a total reflection condition may exist on the interface of the waveguide 40 and the air. In other words, a constant total reflection condition may exist in the entire area of the keypad 2, as the light A1 satisfying the total reflection condition in the interface of the auxiliary layer 60 and the waveguide 40 also satisfies the total reflection condition in the interface of the waveguide 40 and the air.

The waveguide 40 and the auxiliary layer 60 may be made of a transparent elastic material such as polycarbonate, acryl, polyurethane, silicone, and the like. Meanwhile, the auxiliary layer 60 is made of a material having lower refractive index than that of the waveguide 40. For example, the waveguide 40 may be made of polycarbonate having a refractive index of 1.58, and the auxiliary layer 60 and the pressing protrusions 2*c* may be made of silicon having a refractive index of 1.41.

Figure 4:
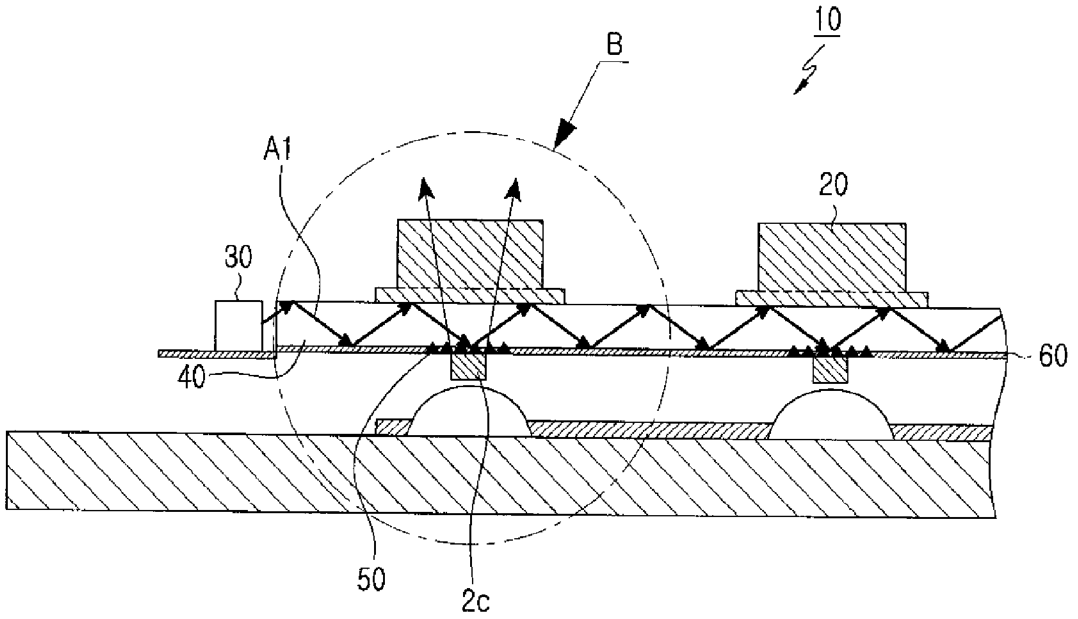
FIG. 4 is a cross-sectional view of a second example of a keypad assembly according to the first aspect of the present invention.
Figure 5:
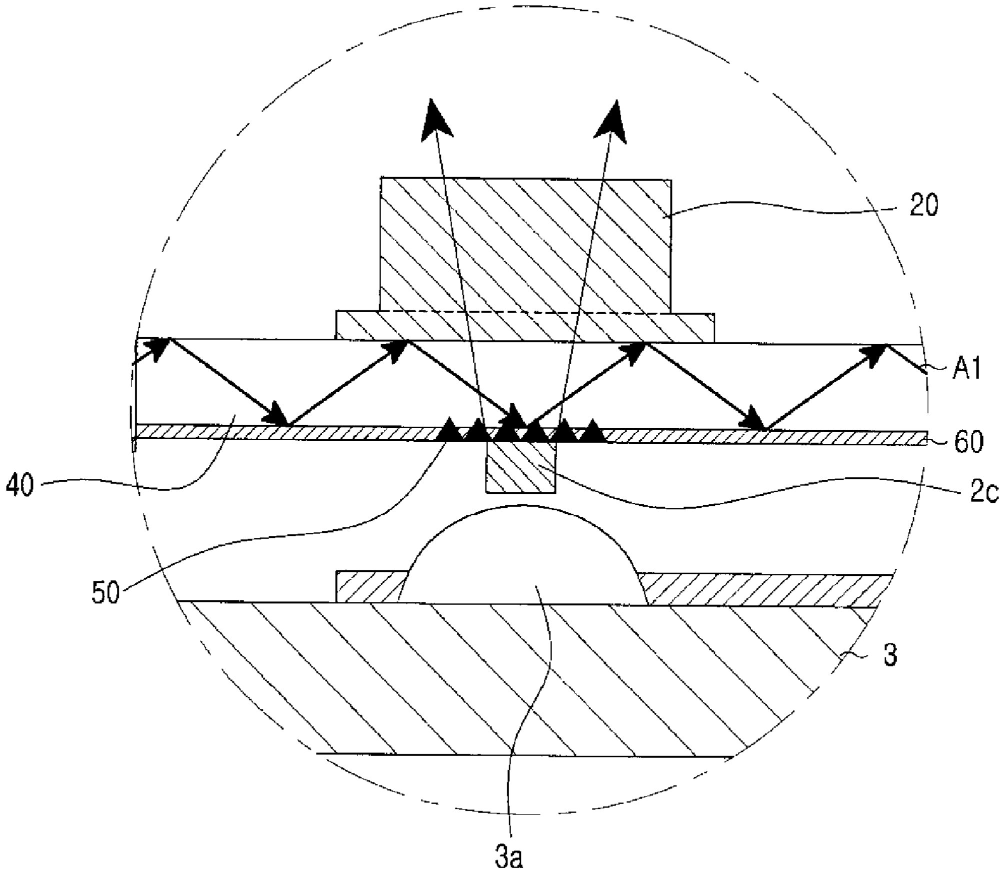
FIG. 5 is an exploded cross-sectional view of a portion B of FIG. 4.

FIGS. 4 and 5 show the second example of the of the assembly keypad according to the first aspect of the present invention. According to the second example, the auxiliary 60 may be formed on the lower surface of the waveguide 40. In addition, the reflecting patterns 50 of the second example may be formed on the entire lower surface of the waveguide 40 according to the second example. Such reflecting pattern 50 reflects a portion of the light A1 traveling through the waveguide 40 toward the key buttons 20. Alternatively, the reflecting patterns 50 may be formed on a portion of the lower surface of the waveguide 40.

The reflecting patterns 50 may be manufactured in such a way to make a diffuse reflection condition in the interface of the waveguide 40 and the auxiliary layer 60. For example, the reflecting patterns 50 may be formed such a way to achieve uneven waveguide 40 surface. In addition, the reflecting patterns 50 may be formed by process involving prints, embossing, laser machining or other process.

Figure 6:
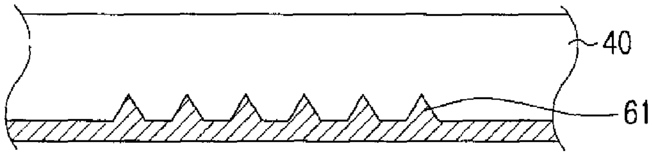
FIG. 6 is a cross-sectional view of a third example of the keypad assembly according to the first aspect of the present invention.

FIG. 6 shows a third example of the of the assembly keypad according to the first aspect of the present invention. As illustrated in FIG. 6, the third example of the assembly pad includes a protrusion member 61 that has a shape similar to the reflecting pattern 50 illustrated in FIGS. 4 and 5 and that is formed on the auxiliary layer 60.

Figure 7:
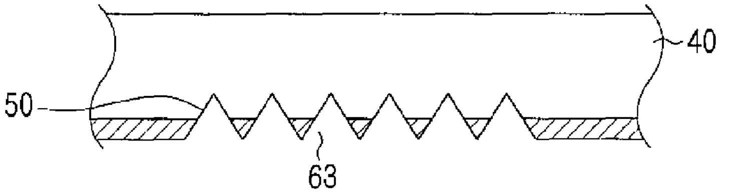
FIG. 7 is a cross-sectional view of a fourth example of the keypad assembly according to the first aspect of the present invention.

FIG. 7 illustrates a fourth example of the assembly keypad according to the first aspect of the present invention. As illustrated in FIG. 7, the lower surface of the waveguide 40 is coated with the auxiliary layer 60, and holes 63 is formed on a portion of the auxiliary layer 60 such that the reflecting pattern 50 is formed.

The operation of the keypad assembly 10 according to the first aspect of the present invention will be described in detail with reference to FIG. 2-7.

As illustrated in FIGS. 2 and 3, the keypad assembly 10 includes the plurality of key buttons 20, the plurality of light emitting devices 30, the waveguide 40, the plurality of reflecting patterns 50, and the auxiliary layer 60. The waveguide 40 is provided under the key buttons 20, and the light emitting devices 30 are disposed at sides of the key buttons 20. As illustrated in FIG. 2, the auxiliary layer 60, which may be made of a transparent film, may be coated or attached to the upper surface of the waveguide 40.

Upon emission of the light A1 from the light emitting device 30, the light A1 enters the waveguide 40 and travels through the waveguide 40. As illustrated in FIG. 3, if the traveling angle of the light A1 is less than the total reflection threshold angle, the threshold angle determined by the difference of the reflective indexes of the waveguide 40 and the auxiliary layer 60, the light A1 satisfies the total, internal reflection condition. As the interface with air having a refractive index of 1 is also formed on the lower surface of the waveguide 40, the light A1 satisfying the total reflection condition in the interface between the waveguide 40 and the auxiliary layer 60 may travel throughout the waveguide 40 if the light A1 also satisfies the total reflection condition on the lower surface of the waveguide 40.

However, a component such as the reflecting pattern 50, which alters the traveling angle of light incident upon the reflecting pattern 50, induces a portion of the light A1, the light which otherwise satisfies the total internal reflection, to be emitted from the waveguide 40. As such, the traveling light A1 illuminates the key button 20 through the reflecting pattern 50.

In particular, the light A1 incident on the waveguide 40, which satisfies the total reflection threshold angle, the threshold angle determined by the refractive index of the waveguide 40 and the refractive index of the auxiliary layer 60, may travel within the waveguide 40 without a loss, and may be selectively be emitted only to an area that requires illumination. Further, the intensity of the emission may be adjusted according to the density and the size of the reflecting pattern 50. As such, the keypad assembly 10 of the first aspect of the present invention is capable of uniformly illuminating the entire area of the keypad 2 with a small number of light emitting devices 30.

In the first aspect of the present invention, the waveguide 40 may be made of polycarbonate having a refractive index of 1.5 and the auxiliary layer 60 and the pressing protrusions 2*c* may be made of silicon having a refractive index of 1.41.

As illustrated in FIGS. 4 and 5, the auxiliary layer 60 may also be formed on the lower surface of the waveguide 40.

If the auxiliary layer 60 is formed on the lower surface of the waveguide 40, the protrusion member 61 may be formed, as illustrated in FIG. 6, on the auxiliary layer 60. The protrusion member 61 may have a shape corresponding to that of the reflecting pattern 50 formed on the waveguide 40.

As illustrated in FIG. 7, the auxiliary layer 60 may also be formed on the lower surface of the waveguide 40, and then the reflecting pattern 50 may be formed by forming the holes 63 on the auxiliary layer 60.

As illustrated in FIG. 4, once the light A1 emitted from the light emitting device 30 is guided into the waveguide 40, the light A1 can be guided while maintaining a constant total reflection condition. In particular, a portion of the light A1 emitted from the light emitting device 30, which satisfies the total reflection threshold angle determined by the refractive index of the waveguide 40 and the refractive index of air, is guided over the entire area of the keypad 2 without loss. If the angle of the light A1 is changed by the reflecting pattern 50 formed under the key button 20, the light whose traveling angle exceeds the total reflection threshold angle may be emitted from the waveguide 40 to the key button 20. In addition, the amount of light emitted through the key button 20 can be adjusted by changing the size and density of the reflecting pattern 50. As such, the entire area of the keypad 2 may be uniformly illuminated.

As illustrated in FIGS. 2 and 3, the auxiliary layer 60 made of lower refractive index than that of the waveguide 40 may be coated or attached to the waveguide 40. The total reflection threshold angle in the waveguide 40 is determined by the refractive index of the auxiliary layer 60 and the refractive index of the waveguide 40. The light A1 whose traveling angle is less than the total reflection threshold angle is guided throughout the waveguide 40 without loss.

As the key buttons 20 are formed above the upper surface of the auxiliary layer 60, and as long as the refractive index of the pressing protrusion 2*c* is equal to or less than that of the auxiliary layer 60, same reflection threshold angles are applied to the entire area of the keypad 2. If the refractive index of the pressing protrusion 2*c* is greater than that of the auxiliary layer 60, the total reflection threshold angle is reduced at the interface of the pressing protrusion 2*c* and the waveguide 40. In such a case, the light A1, whose traveling angle is less than the total reflection threshold angle, is emitted from the waveguide 40.

In addition, as the light A1 is emitted only through the reflecting pattern 50, the amount of light emitted through the key button 20 may be adjusted according to the size and density of the reflecting pattern 50. For this reason, the reflecting pattern 50 needs to be designed based on the amount of emitted light, which varies with the refractive index of the pressing protrusion 2*c*.

As illustrated in FIGS. 4 and 5, the auxiliary layer 60 made of lower refractive index than that of the waveguide 40 may be coated or attached to the waveguide 40. The pressing protrusion 2*c* may be formed simultaneously with the auxiliary layer 60 or may be separately attached. The total reflection threshold angle in the waveguide 40 is determined by the refractive index of the auxiliary layer 60 and the refractive index of the waveguide 40. In addition, the light A1 whose traveling angle is less than the total reflection threshold angle is guided without loss. The pressing protrusion 2*c* is formed under the auxiliary layer 60; and as such, its refractive index does not change the total reflection threshold angle.

However, when the refractive index of an adhesive (not shown) used to attach the key button 20 to the waveguide 40 is greater than that of the auxiliary layer 60, the total reflection threshold angle in an interface between the adhesive (not shown) and the waveguide 40 may be reduced. In the process, the light that does not satisfy the total reflection threshold angle may be emitted from the waveguide 40. Therefore, the reflecting pattern 50 needs to be designed based on the amount of emitted light, which varies with the refractive index of the adhesive (not shown).

Figure 8:
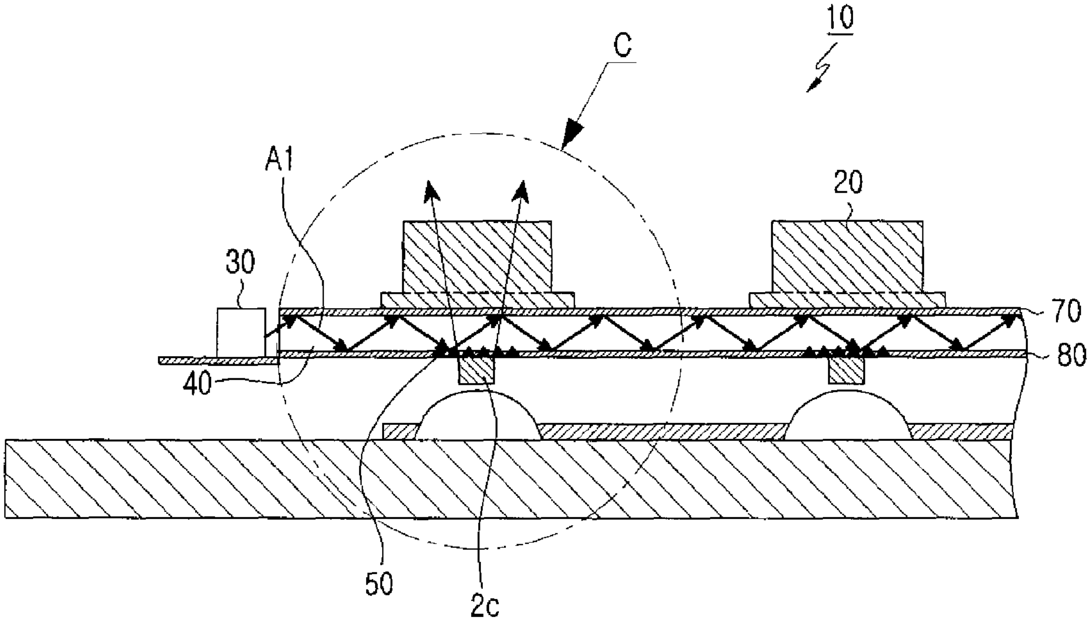
FIG. 8 is a cross-sectional view of a keypad assembly according to a second aspect of the present invention.
Figure 9:
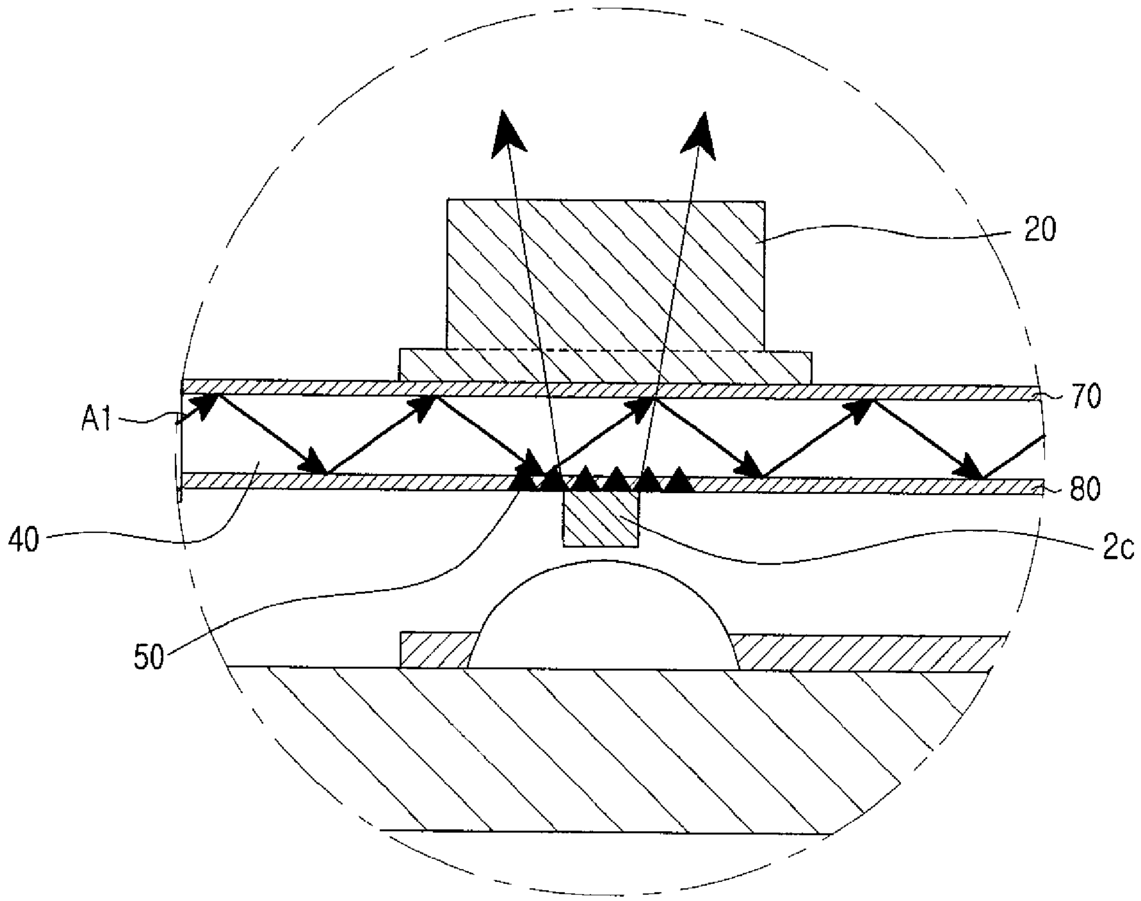
FIG. 9 is an exploded cross-sectional view of a portion C of FIG. 8.

FIGS. 8 and 9 illustrates second aspect of the present invention. The keypad assembly 10 according to second aspect of the present invention includes a plurality of key buttons 20, a plurality of light emitting devices 30, a waveguide 40, a plurality of reflecting patterns 50, a first auxiliary layer 70, and a second auxiliary layer 80. The waveguide 40 is formed under the key button 20 and the light emitting device 30 is disposed at a side of the key button 20.

As illustrated in FIG. 8, the first auxiliary layer 70 is formed on the upper surface of the waveguide 40, and the second auxiliary layer 80 is formed on the lower surface of the waveguide 40. According to the second aspect of the present invention the first auxiliary layer 70 and the second auxiliary layer 80 may be made of transparent films.

The operation of the keypad assembly 10 according to the second aspect of the present invention will be described in detail with reference to FIGS. 8 and 9.

Upon emission of the light A1 from the light emitting device 30, the light A1 enters the waveguide 40 and travels through the waveguide 40. If the traveling angle of the light A1 is less than a total reflection threshold angle, the threshold angle determined by a difference between the refractive indices of the first and second auxiliary layers 70 and 80, and the waveguide 40, the light A1 satisfies the internal total reflection condition.

As such, the light A1 entering the waveguide 40 may travel throughout the waveguide 40 without loss in the intensity, as long as the total, internal reflection condition within the waveguide 40 is satisfied. However, if the total, internal reflection condition is interrupted by components such as the reflection pattern 50, the reflection pattern 50 that may alter the traveling angle of the light, the light A1 may be emitted from the waveguide 40.

As illustrated in FIGS. 8 and 9, the light A1 incident to the waveguide 40 satisfies the total reflection condition and travels through the waveguide 40 without loss. In addition, a portion of the light A1 is emitted from the waveguide 40 by the reflection pattern 50 to only an area that requires illumination.

The amount of emitted light can be adjusted by the density and size of the reflecting pattern 50, thereby uniformly illuminating the entire area of the keypad 2 with a small number of light emitting devices 30.

As illustrated in FIGS. 8 and 9, the total reflection threshold angle is not affected by the refractive indices of an adhesive (not shown) and the pressing protrusion 2*c*. For this reason, the amount of emitted light can be adjusted only by the design of the reflecting pattern 50.

While the invention has been shown and described with reference to exemplary embodiments thereof it will be understood by those skilled in the art that various changes in form and details may be made therein without departing from the spirit and scope of the invention.

For example, the present invention can be applied to all types of portable electronic devices.

What is claimed is:

1. A keypad assembly including a switch board having a plurality of dome switches, the keypad assembly comprising:
- a plurality of key buttons;
- a plurality of light emitting devices;
- a waveguide being disposed under the key buttons and having a predetermined refractive index such that lights emitted from the light emitting devices and entering the waveguide travels according to an internal total reflection condition;
- a plurality of reflecting patterns being disposed on an inner surface of the waveguide and being configured to reflect the light traveling within the waveguide toward the key buttons; and
- an auxiliary layer being disposed on an upper surface of the waveguide along an entirety of the upper surface of the waveguide including respective surfaces corresponding to a position of each of the plurality of key buttons, said auxiliary layer having a lower refractive index than the waveguide, and being configured to induce a constant total reflection condition for a traveling angle of light that is less than a total reflection angle threshold determined by a first interface of the auxiliary layer and the waveguide at the upper surface of the waveguide and a second interface of the waveguide and air at a lower surface of the waveguide;
- wherein the plurality of reflecting patterns being disposed in the waveguide are configured to change the traveling angle of light incident thereon to exceed a total reflection angle threshold; and
- wherein a plurality of protrusion members are disposed under the waveguide and the plurality of reflecting patterns; and
- wherein a plurality of dome switches on top of a switchboard are arranged below the waveguide and the protrusion members, and the plurality of dome switches are spaced apart from the waveguide and the protrusion members.

2. The keypad assembly of claim 1, wherein the auxiliary layer is made of a transparent film.

3. The keypad assembly of claim 1, wherein the auxiliary layer is coated along the surface of the waveguide.

4. The keypad assembly of claim 1, wherein the auxiliary layer is coated onto the upper surface of the waveguide.

5. The keypad assembly of claim 4, wherein the key buttons are disposed on the auxiliary layer.

6. The keypad assembly of claim 1, wherein the auxiliary layer is coated onto the lower surface of the waveguide, and wherein the protrusion members are disposed on the auxiliary layer.

7. The keypad assembly of claim 1, wherein the auxiliary layer is coated onto the lower surface of the waveguide, and wherein holes are formed, in the auxiliary layer, simultaneously with the reflecting patterns.

8. The keypad assembly of claim 1, wherein the auxiliary layer is formed on the lower surface of the waveguide, along the outer lateral face of a pressing protrusion that is formed in the keypad.

9. The keypad assembly of claim 1, wherein the auxiliary layer is made of one of polycarbonate, acryl, polyurethane, and silicone.

10. The keypad assembly of claim 9, wherein the waveguide is made of polycarbonate having a refractive index of 1.5 and the auxiliary layer is made of silicone having a refractive index of 1.41.

11. The keypad assembly of claim 1, wherein the refractive index of the auxiliary layer ranges from 1.3 to 1.5.

12. The keypad assembly of claim 1, wherein the auxiliary layer is coated over the entire surface of the waveguide and is coated partially on the bottom surface of the key button.

13. The keypad assembly of claim 1, wherein the auxiliary layer comprises a plurality of layers.

14. The keypad assembly of claim 1, wherein the plurality of reflecting patterns being disposed in the waveguide are configured to change the traveling angle of incident light reflecting thereon to exceed a threshold angle for the total internal reflection condition; and
- wherein the protrusion member has a refractive index equal to or less than the refractive index of the lower surface of the waveguide and does not change the threshold angle for the total internal reflection condition.

15. The keypad assembly of claim 1, wherein the plurality of protrusion members protrude outwardly from the waveguide.

16. The keypad assembly of claim 1, wherein the plurality of reflecting patterns are grooves formed on the lower surface of the waveguide.

17. A keypad assembly including a plurality of key buttons, a plurality of light emitting devices for emitting lights to the key buttons, and a switch board having a plurality of dome switches, the keypad assembly comprising:
- a waveguide being disposed under the key buttons, having a predetermined refractive index, and being configured to allow the lights entering the waveguide from the light emitting devices to travel according to an internal total reflection condition;
- a plurality of reflecting patterns formed in the waveguide to reflect the light traveling through the waveguide toward the key buttons; and
- a first auxiliary layer and a second auxiliary layer formed on upper and lower surfaces of the waveguide, respectively, the first and second auxiliary layers having refractive indices that are lower than that of the waveguide to induce a constant total reflection condition in the entire area of a keypad for a traveling angle of light that is less than a total reflection angle threshold determined by a first interface of the first auxiliary layer and the waveguide at the upper surface of the waveguide and a second interface the second auxiliary layer and the lower surface of the waveguide throughout an entirety of the upper and lower surfaces of the waveguide including respective surfaces corresponding to a position of each of the plurality of key buttons along the upper surface of the waveguide;

wherein the plurality of reflecting patterns being disposed on an inner surface of the waveguide are configured to change a traveling angle of light incident thereon to exceed a total reflection angle threshold determined by the first interface of the first auxiliary layer and the waveguide; and wherein a plurality of protrusion members are disposed under the second auxiliary layer and the plurality of reflecting patterns; and wherein a plurality of dome switches on top of a switch-board are arranged below the waveguide and the protrusion members, and the plurality of dome switches are spaced apart from the waveguide and the protrusion members.

18. The keypad assembly of claim 17, wherein the plurality of reflecting patterns being disposed in the waveguide are configured to change the traveling angle of incident light reflecting thereon to exceed a threshold angle for the total internal reflection condition; and wherein the protrusion member has a refractive index equal to or less than the refractive index of the lower surface of the waveguide and does not change the threshold angle for the total internal reflection condition.

19. The keypad assembly of claim 17, wherein the plurality of protrusion members protrude outwardly from the waveguide.

20. The keypad assembly of claim 17, wherein the plurality of reflecting patterns are grooves formed on the lower surface of the waveguide.

* * * * *